US008332698B2

United States Patent
Tang et al.

(10) Patent No.: US 8,332,698 B2
(45) Date of Patent: Dec. 11, 2012

(54) SCAN LATCH WITH PHASE-FREE SCAN ENABLE

(75) Inventors: Bo Tang, Sunnyvale, CA (US); Edgardo F. Klass, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 189 days.

(21) Appl. No.: 12/784,748

(22) Filed: May 21, 2010

(65) Prior Publication Data

US 2011/0289372 A1 Nov. 24, 2011

(51) Int. Cl.
*G01R 31/28* (2006.01)

(52) U.S. Cl. ........................................ 714/726

(58) Field of Classification Search .................. 714/726, 714/727, 729, 731
See application file for complete search history.

(56) References Cited

U.S. PATENT DOCUMENTS

| | | | | |
|---|---|---|---|---|
| 6,662,325 | B1 * | 12/2003 | Golshan ........................ | 714/726 |
| 7,082,560 | B2 * | 7/2006 | Parulkar et al. ............... | 714/726 |
| 7,188,285 | B2 * | 3/2007 | Natsume ....................... | 714/727 |
| 7,328,385 | B2 | 2/2008 | Warren et al. | |
| 7,352,169 | B2 * | 4/2008 | Abraham et al. ......... | 324/762.02 |
| 7,380,189 | B2 * | 5/2008 | Konuk .......................... | 714/731 |
| 7,457,998 | B1 * | 11/2008 | Bhatia et al. ................. | 714/726 |
| 7,543,207 | B2 | 6/2009 | Chua-Eoan et al. | |
| 7,590,906 | B2 * | 9/2009 | Miwa ............................ | 714/726 |
| 7,596,732 | B2 * | 9/2009 | Branch et al. ................. | 714/726 |
| 7,613,972 | B2 * | 11/2009 | Takeoka et al. ............... | 714/731 |
| 7,747,917 | B2 * | 6/2010 | Putman et al. ................ | 714/726 |
| 7,752,513 | B2 * | 7/2010 | Namura et al. ............... | 714/726 |
| 7,796,445 | B1 | 9/2010 | Biyani et al. | |
| 7,882,410 | B2 * | 2/2011 | Ayres et al. ................... | 714/731 |
| 7,895,488 | B1 * | 2/2011 | Bertanzetti ................... | 714/728 |
| 7,952,390 | B2 * | 5/2011 | Takatori et al. ................ | 326/93 |
| 2008/0307280 | A1 | 12/2008 | Putman et al. | |

* cited by examiner

*Primary Examiner* — James C Kerveros
(74) *Attorney, Agent, or Firm* — Lawrence J. Merkel; Erik A. Heter; Meyertons, Hood, Kivlin, Kowert & Goetzel, P.C.

(57) ABSTRACT

A number of scan flops clocked by a master clock may be used to constructing a scan chain to perform scan tests. During a scan test, data appearing at the regular data input of each scan flop may be written into a master latch of the scan flop during a time period when the scan control signal is in a state corresponding to a capture cycle. A slave latch in each scan flop may latch a value appearing at the regular data input of the scan flop according to a narrow pulse triggered by the rising edge of the master clock when the scan control signal is in the state corresponding to the capture cycle. The slave latch may latch the data provided by the master latch according to a wide pulse triggered by the rising edge of the master clock when the scan control signal is in a state corresponding to a shift cycle. This may permit toggling the scan control signal during either a high phase or a low phase of the master clock, and may also enable testing the pulse functionality of each scan flop.

18 Claims, 7 Drawing Sheets

SCAN LATCH WITH PHASE-FREE SCAN ENABLE

BACKGROUND

1. Field of the Invention

This invention is related to the field of design testing, more specifically to the design of a scan latch for which scan may be enabled in either clock phase.

2. Description of the Related Art

Design testability plays an important role in integrated circuit (IC) design, since it facilitates discovering defects that may be present in the fabricated circuit. One of the most common methods for delivering test data from IC inputs to the internal circuitry being tested is through a methodology called scan design. Scan design allows shifting in test data through the input pins of the IC, and detecting defects by observing data returned on output pins of the IC. The scan process is implemented through special registers called scan registers (also referred to as scan flops and scan cells), which are connected in one or more scan chains that are used for gaining access to various internal nodes and functional logic portions of the IC. Most of the time a scan flop is designed having both shift and parallel-loading capability, and may include a number of storage cells or latches to be used as observation points and/or control points. Scan flops therefore enhance observability and/or controllability of a circuit during the testing process.

When performing a scan test, the scan flops are typically controlled by an additional signal called a scan enable (SE) signal. Using the SE signal, scan flops in the IC, or in a given designated portion of the IC, can be operated together as a long shift register, with data provided to the shift register through a designated input pin(s) of the IC, and data read from the shift register through a designated output pin(s) of the IC. Test patterns can be shifted in via the scan chain(s), using the IC's clock signal or functional clock signals within the IC to clock the shifting process, as well as the capture of the test data. Once the data has been shifted in, the test itself is performed during what is referred to as a "scan cycle" or "capture cycle". The capture cycle is initiated by changing the value of the SE signal, resulting in the capture of data from the internal circuitry being tested. The value of the SE signal is then changed back to shift out the results to the designated output pin(s). The test that has been thus obtained can then be compared against expected results.

While there is some degree of freedom in how scan operations for a given IC are performed, and how scan flops are structured, scan flop designs are oftentimes influenced by a multitude of factors, and a great variety of scan flop designs and scan flop clocking techniques exist. In order to gain advantage in some areas, constraints may have to be imposed in other areas. For example, in some scan flops the SE signal is restrained to be operated as a low-phase (of the clock) signal in order for the scan flop and the scanning process to function correctly. That is, the SE signal can only be asserted to initiate the capture cycle (or scan cycle) during a low phase of the clock, which imposes an undue limit on the use of the SE signal.

SUMMARY

In one set of embodiments, an integrated circuit (IC) may be designed using at least one scan chain. The scan chain may be constructed using a sequence of scan flops coupled in series, with each scan flop having a scan output coupled to a scan input of a next scan flop in the sequence. The scan input of a leading scan flop (that is, the first scan flop) in the chain may be coupled to a designated input pin of the IC for receiving scan test data, while the scan output of a trailing scan flop (that is, the last scan flop) in the chain may be coupled to a designated output pin of the IC for providing scan result data. Each scan flop (also referred to herein as scan register and scan latch) may also have a data input and a data output for coupling to internal logic circuitry of the IC, to provide input data to the internal logic circuitry and receive output data from the internal logic circuitry, respectively. The scan flop may also include an internal clock gating circuit that may receive a "master" clock or main clock, for example a system clock, and derive an internal flop clock signal from the received clock signal for clocking certain signals inside the scan flop.

Each scan flop may include a master latch and a slave latch. The master latch may be clocked using the main clock, while the slave latch may be clocked using the internal flop clock. Furthermore, the master latch may be clocked on the low phase of the main clock, while the slave latch may be clocked on the high phase of the flop clock. A backup write may be used to write regular data (that is, not scan data that is shifted in but data received from the tested circuitry) into the master latch through the data input of the scan flop when a scan enable (SE) signal is in a state that corresponds to a scan cycle. As referenced herein, the SE signal is said to be in a scan state when it is toggled to a value that corresponds to a scan cycle, and it said to be in a shift state when it is toggled to a value that corresponds to a shift cycle. As a result of the backup write, the SE signal may be toggled during either the high phase or the low phase of the clock signal, to shift in scan test data, capture scan result data, and shift out the scan result data during a scan test. The scan result data, or capture data may be captured during either a glitch pulse of the flop clock (representing a high phase of the flop clock) when the SE signal is in a scan state, or during a wider pulse of the flop clock (also representing a high phase of the flop clock) when the SE signal is in a shift state, depending on whether the SE signal is toggled during a low phase of the main clock or during a high phase of the main clock.

Consequently, in addition to enabling the SE signal to toggle during either one of the high phase of the system (main) clock and low phase of the system clock, proper operation of the glitch pulse of the flop itself may be tested. For example, when the SE signal is toggled during a high phase of the main clock, the scan output of the scan flop may follow the data input of the scan flop through the master latch and the slave latch during the test capture (that is, when the scan result data is captured). On the other hand, when the SE signal is toggled during a low phase of the system clock, the scan output of the scan flop may follow the data input of the scan flop through the glitch pulse window of the flop clock during the test capture. If the glitch pulse window of the flop clock is not operating properly, for example it is not wide enough for writability, or it doesn't meet minimum path timing or process variation requirements, etc., it may be verified by toggling the SE signal during both a low phase of the system clock, then again during a high phase of the system clock. When the scan result data is not what is expected when the SE signal is toggled during the low phase of the system clock, but the expected results are shifted out when the SE signal is toggled during the high phase of the system clock, it may indicate a problem with the operation of the glitch pulse of the flop clock.

BRIEF DESCRIPTION OF THE DRAWINGS

The following detailed description makes reference to the accompanying drawings, which are now briefly described.

Figure 1:
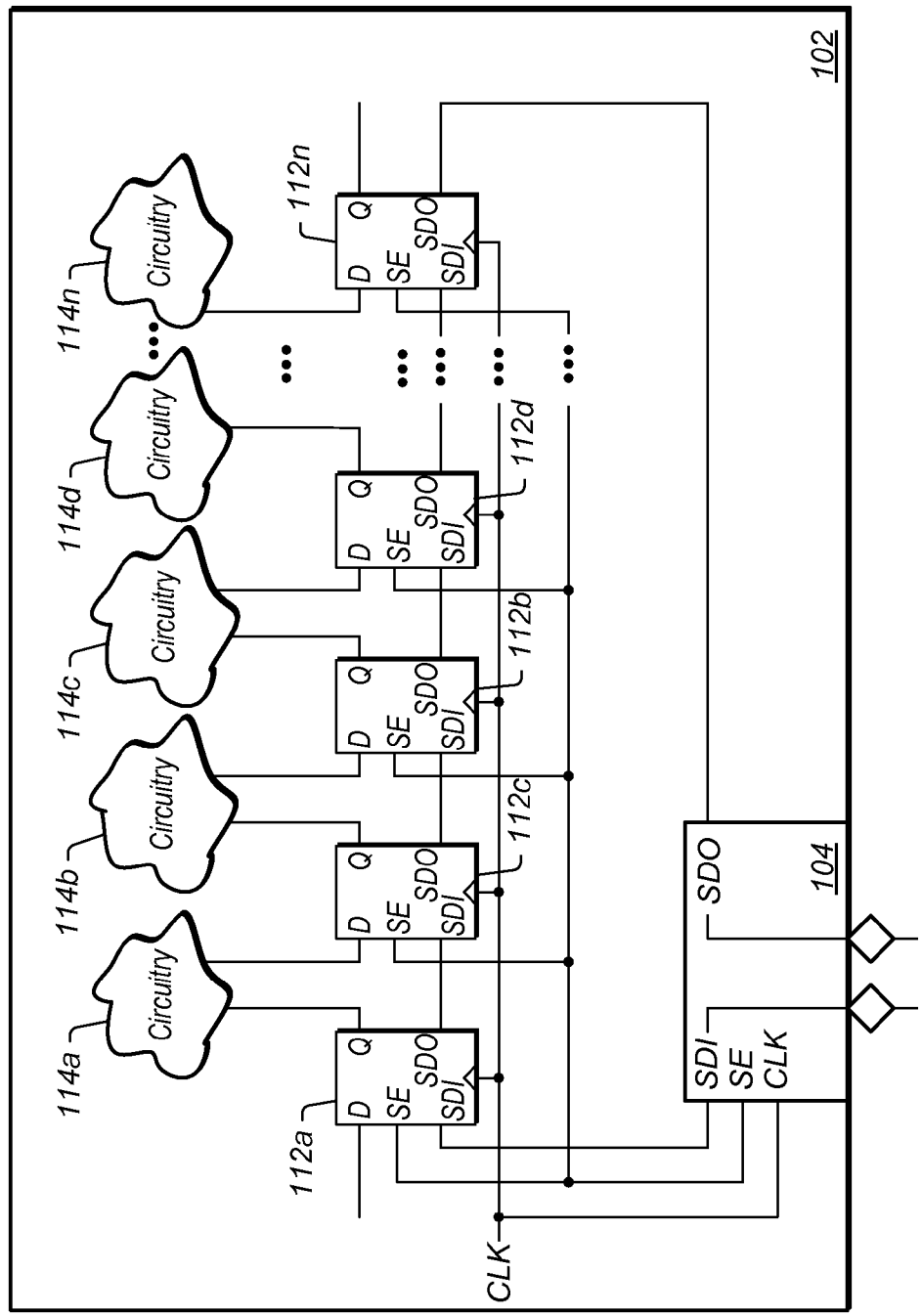
FIG. 1 shows a high-level block diagram of one embodiment of a scan chain within an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

As referenced herein, the scan enable (SE) signal is said to be in a scan state when it is toggled to a value that corresponds to a scan cycle, and it said to be in a shift state when it is toggled to a value that corresponds to a shift cycle. In some embodiments, the SE signal may be deasserted to transition into a scan cycle, which may be accomplished by toggling the SE signal from a logic high value to a logic low value. Conversely, the SE signal may be asserted to exist a scan cycle and transition into a shift cycle, which may be accomplished by toggling the SE signal from a logic low value to a logic high value. In some embodiments, the actual time period during which the value of the SE signal is indicative of a scan cycle (i.e. the SE signal is in a scan state) may partially overlap with a portion of a cycle of the system clock that corresponds to a shift cycle. In general, when the value of the SE signal is toggled during a high phase of the main clock, the clock cycle in which that high phase occurs may correspond to the second phase of a shift cycle immediately preceding the scan cycle. Similarly, when the value of the SE signal is toggled during a low phase of the main clock, the clock cycle in which that low phase occurs may correspond to the scan cycle.

FIG. 1 shows a high-level block diagram of one embodiment of a scan chain within an integrated circuit (IC) 102. As shown in FIG. 1, a sequence of scan flip-flops (also referenced herein as scan latches and scan flops) may be coupled to form a scan chain. The scan chain may be controlled via a scan control unit 104. Scan data may be provided to controller 104 through an input pin (or multiple input pins) of IC 102, and shifted into scan flops 112a-112n. Each one of scan flops 112a-112n may have its scan data output (SDO) coupled to the scan data input (SDI) of a next scan flop in the scan chain, with the SDO of the last (or final) scan flop in the chain coupled to controller 104, to provide the scan result data at an output pin of IC 102. Each scan flop may also have a data output (Q) coupled to a respective portion of internal logic circuitry 114a-114, to provide the scan test data (that was shifted in through the scan chain) to the first respective portion of the internal logic circuitry.

Each scan flop in the scan chain may also have a data input (D) that may receive data from the respective portion of the internal circuitry to which a preceding scan flop in the scan chain is providing data. The control block (circuit) 104 and scan flops 112a-112n may all be clocked on a "master" or system clock as shown. The SE signal in control block 104 may be toggled to operate in either a shift mode or scan mode. During shift mode, data provided to a corresponding input pin of IC 102 may be serially shifted in through the SDI port of control block 104, into scan flops 112a-112n in the scan chain. During each cycle of the clock signal (CLK), data at the SDO of one scan flop may be shifted to the next (successive) scan flop in the scan chain through the next scan flop's SDI port. Once all the scan test data has been shifted into the scan chain, the SE signal in control block 104 may be toggled to transition into a scan cycle, during which the data at the respective data inputs (D) of scan flops 112a-112n may be captured by each scan flop. The SE signal may then be toggled again to enter shift mode, during which the captured (scan result) data may be shifted out through the SDO port of control block 104 to the corresponding designated output pin of IC 102.

The above description with regards to the embodiment shown in FIG. 1 highlights one possible way of performing a scan test. Uses of various embodiments of scan flops described herein are not limited to constructing and operating the scan chain shown in FIG. 1, which is meant to provide an illustration for how the various embodiments of scan flops disclosed herein may be used. One of ordinary skill in the art will appreciate that the disclosed embodiments of scan flops may equally be used in various other scan chains and scan testing schemes, which, although not explicitly disclosed herein are nonetheless contemplated.

Figure 2A:
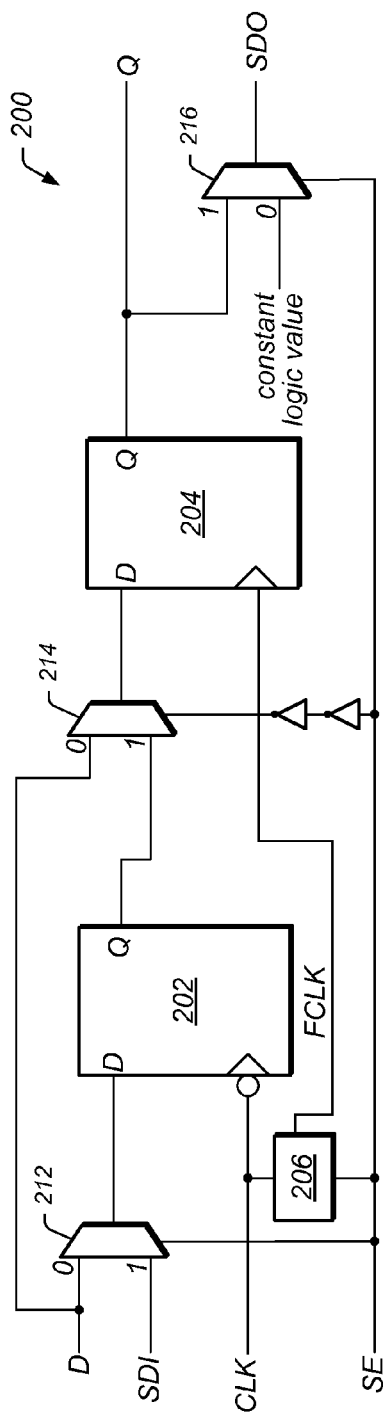
FIG. 2a shows the logic diagram of one embodiment a novel scan flip-flop, or scan flop.

FIG. 2a shows the logic diagram of one embodiment a novel scan flip-flop, or scan flop 200, which may be used, for example, to implement each one of scan flops 112a-112n in the embodiment of the scan chain shown in FIG. 1. Scan flop may have a regular data input D, a scan data input SDI, a clock input CLK, and a scan enable input SE, and a regular data output Q and scan data output SDO. Scan flop 200 may include a first latch 202, also referenced herein as the master latch, and a second latch 204, also referenced herein the slave latch. Latches 202 and 204 may be pulse-triggered latches. Master latch 202 may be clocked one the negative phase of the master clock signal CLK (that is, when CLK is low), while slave latch 204 may be clocked on the positive phase on an internal scan flop clock (that is, when internal flop clock FCLK is high) provided by clock gating block 206, which may derive FCLK from the input clock signal CLK. Operation of scan flop 200 may be described as follows.

The scan enable (SE) signal may be held in a logic high, that is, a logic '1' state when shifting is performed, and may be toggled to a logic low, that is a logic '0' state when capturing scan result data. In general, the SE signal may be deasserted for scan capture cycles, and asserted for shift cycles. One skilled in the art will appreciate that assertion and deassertion of a signal in the sense that it is performed herein is to assign a given state of the signal to correspond to a given desired type of cycle (either a shift cycle or a capture cycle). The actual logic level and/or corresponding voltage level of a signal may be varied as long as the correspondence is clearly established and results in the desired functionality. For purposes of illustration, the SE signal described herein is asserted when residing at a logic '1' level and deasserted when residing at a logic '0' level. More generally, as previously mentioned, the SE signal is said to reside in a scan state during a scan cycle, and in a shift state during a shift cycle.

During a shift cycle, the SE signal may be asserted, and thus multiplexer 212 may select the SDI input, and multiplexer 214 may select the output of latch 202. This results in data appearing at the SDI input of scan flop 200 to be shifted in and subsequently out of scan flop 200. More specifically, during a shift cycle, during a low phase of CLK, data output by multiplexer 212 (representing data appearing at SDI) may be latched into latch 202, and during a high phase of FCLK, the output of latch 202 may be latched into latch 204. Thus, the data appearing at SDI during a present cycle of CLK will appear at the output Q of scan latch 200 during the subsequent (following) cycle of CLK. In addition, since the SE signal is asserted during the shifting process, the same data will also appear at the SDO of scan latch 200, selected by multiplexer 216. Scan data may thereby be shifted in and out through SDI and SDO of scan latch 200, respectively. Referring back to FIG. 1, when the SDO of one latch is coupled to the SDI of another latch, the data may therefore be shifted through the entire scan chain.

Figure 4:
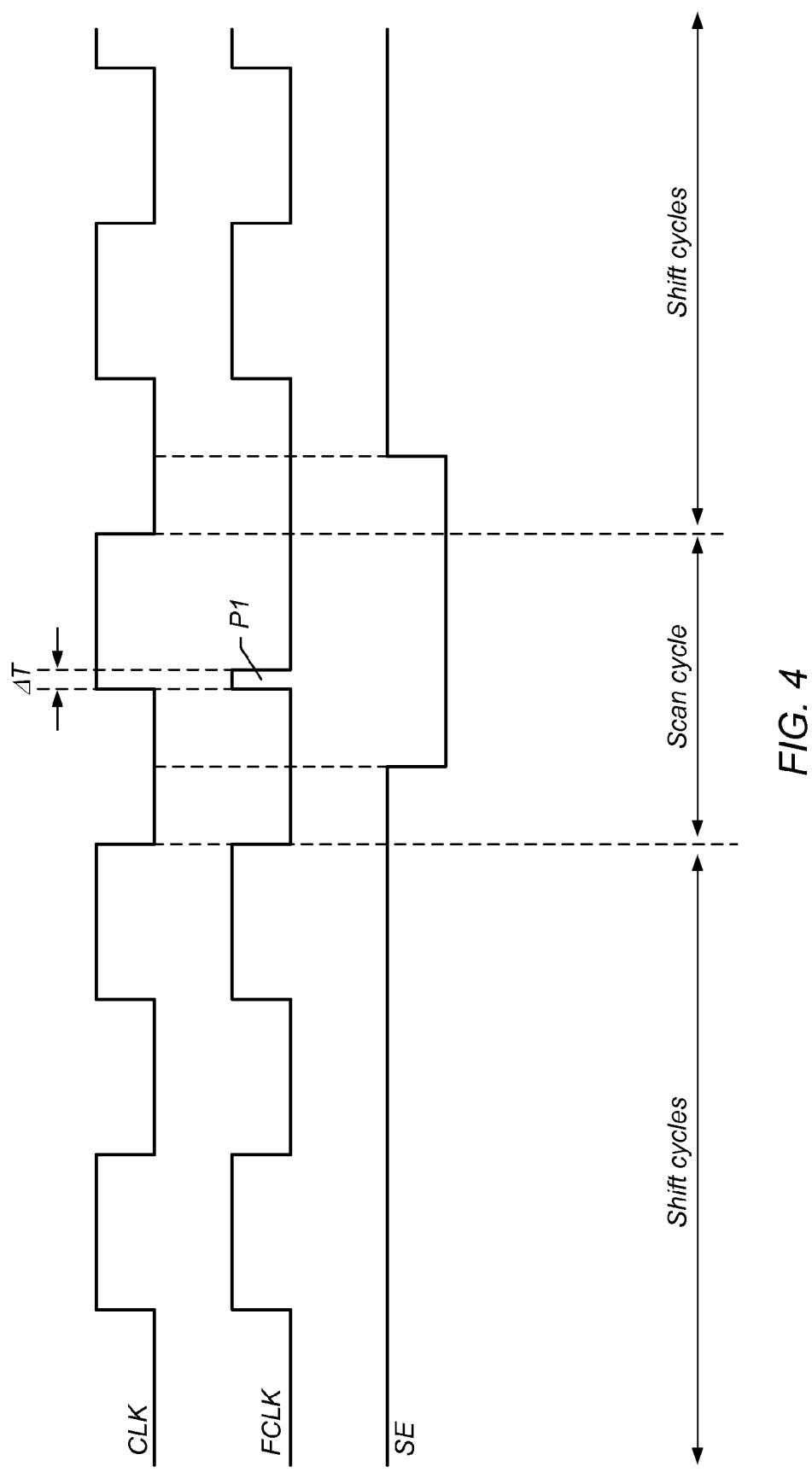
FIG. 4 shows the timing diagram illustrating the timing of various signals when operating a novel scan flip-flop with the scan enable signal toggled during a low phase of the system clock.
Figure 5:
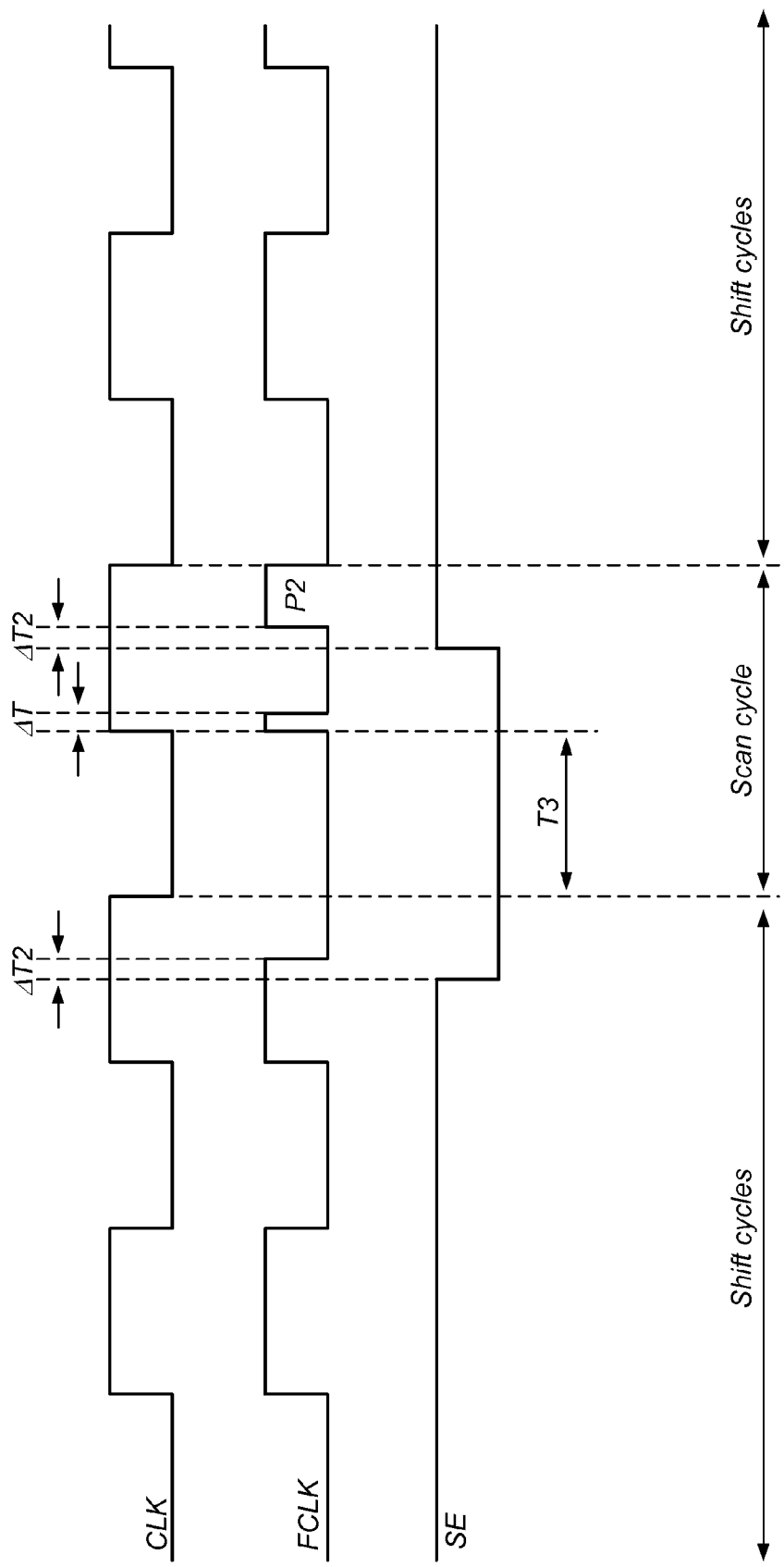
FIG. 5 shows the timing diagram illustrating the timing of various signals when operating a novel scan flip-flop with the scan enable signal toggled during a high phase of the system clock.

During a scan cycle, or capture cycle, the SE signal may be deasserted, and thus multiplexer 202 and multiplexer 204 may both select the D input of scan flop 200. In essence this means that instead of shifting in data appearing at the SDI input of scan flop 200, data appearing at the D input of scan flop 200 will be shifted in and subsequently out of scan flop 200, thereby capturing the result of the scan operation. In what manner the data is latched by latches 202 and 204 when operating in capture mode may be determined by when the SE signal is toggled. More specifically, during a capture (or scan) cycle, if the SE signal is toggled during a low phase of the clock signal CLK, data appearing at the D input may be selected by multiplexer 214 and from the output of multiplexer 214 that data may be latched directly by latch 204 during a high phase of FCLK while the SE signal is still deasserted. A timing diagram illustrating this operating mode is shown in FIG. 4 and will be further discussed below. During a capture cycle, if the SE signal is toggled during a high phase of the clock signal CLK, data appearing at the D input may be selected by multiplexer 212 and latched into latch 202 on the next low phase of CLK while the SE signal is deasserted. The output from latch 202 may then be latched into latch 204 during a next high phase of FCLK before the content of latch 202 is updated again. A timing diagram illustrating this operating mode is shown in FIG. 5 and will be further discussed below.

Figure 2B:
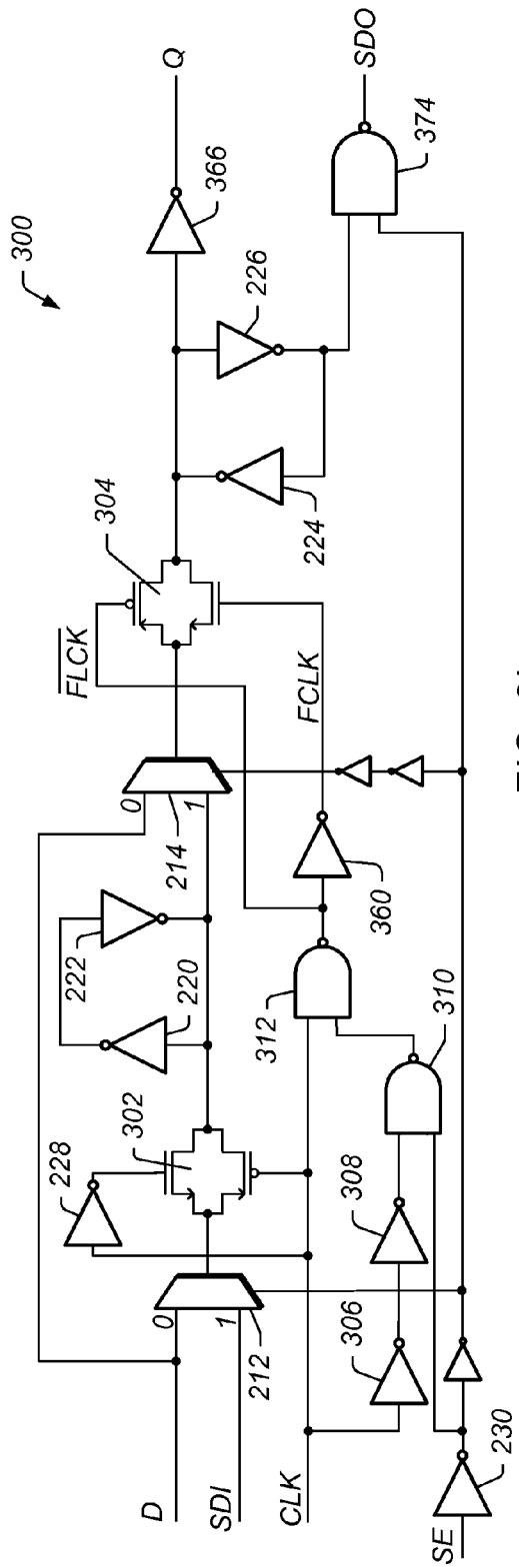
FIG. 2b shows a more detailed logic diagram of one embodiment of the embodiment of the novel scan flip-flop of FIG. 2b.

FIG. 2b shows a more detailed logic diagram of one embodiment 300 of scan flop 200 from FIG. 2a. As seen in FIG. 2b, circuit 206 for generating FLCK may include NAND gates 310 and 312, and inverters 230, 308, 306, and 360. The output of inverter 360 is used to provide the FLCK output (the positive phase of FLCK), and the output of NAND gate 312 is used to provide an inverse phase of FCLK (the negative phase of FLCK). Latches 202 and 204 may each be designed using two inverters in a feedback configuration to form a storage cell, with respective transmission gates used for latching signals into the respective storage cells. Each transmission gate may be implemented using PMOS and NMOS transistor devices as shown. More specifically, latch 202 is implemented using inverters 220 and 222 to form the storage cell, and transmission gate 302 configured to receive the main clock signal such that the transmission gate latches data on the low phase of clock signal CLK, by coupling CLK to the PMOS device of transmission gate 302, and coupling an inverse of CLK to the NMOS device of transmission gate 302. Similarly, latch 204 is implemented using inverters 224 and 226 to form the storage cell, and transmission gate 304 configured to receive FCLK such that the transmission gate latches data on the high phase of clock signal FCLK, by coupling FCLK to the NMOS device of transmission gate 304, and coupling an inverse of FCLK from the output of NAND gate 312 to the PMOS device of transmission gate 304. As seen from the implementation of circuit 206 shown in FIG. 2b, when the value of SE is logic '1', that is, when the value of SE corresponds to a shift cycle, clock signal FCLK signal may track clock signal CLK. Finally, selection element 216 may be simply implemented by NAND gate 374 as shown. It should also be noted that scan flop 300 represents an embodiment of scan flop 200 in which the output of multiplexer 214 represents an inverted version of the input selected by multiplexer 214, which therefore inverted back to its original value via inverter 366.

Figure 3:
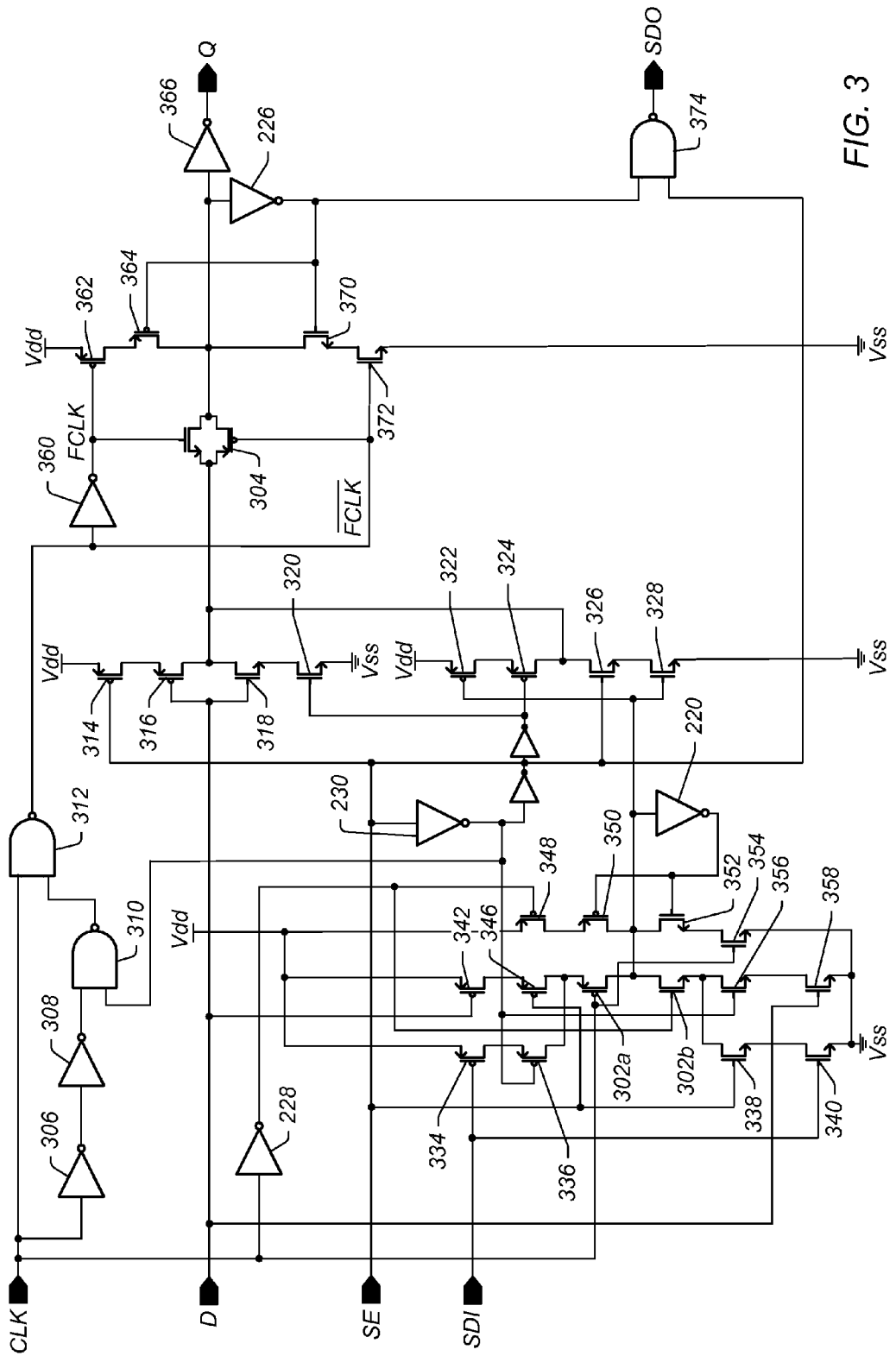
FIG. 3 shows the circuit diagram of one embodiment of the embodiment of the novel scan flip-flop of FIG. 2b.

FIG. 3 shows the circuit diagram of one embodiment of scan flop 300 shown in FIG. 2b. In this embodiment, multiplexer 214 is implemented using PMOS devices 314, 316, 322 and 324, and NMOS devices 318, 320, 326, and 328. Inverter 224 of latch 204 is implemented using PMOS device 364 and NMOS device 370. In addition, PMOS device 362 and NMOS device 372 are used to gate the output of the latch, to prevent contention on the output of the latch when a different value is driven into the latch than the value the latch is currently holding. The gating circuit implemented by transistors 362 and 372 is used in combination with transmission gate 304, which is used for clocking the latch. As shown in FIG. 3, transmission gate 304 is clocked on opposite phases of FCLK with respect to transistors 362 and 372. In other words, when transmission gate 304 is enabled, transistors 362 and 372 are disabled, allowing data transmitted by transmission gate 234 to be conveyed to the input of the latch (i.e. to the input of inverter 226, and consequently, to the output of the inverter implemented with transistor devices 364 and 370). In contrast, when transmission gate 304 is disabled, that is, when transmission gate 304 is not conveying data to the input of the latch, transistors 362 and 372 are turned on, allowing the data value presently held at the output of the latch to remain there.

Also in the embodiment shown in FIG. 3, inverter 222 of latch 202 is implemented using NMOS device 352 and PMOS device 350, with gating transistors 348 and 354, operating in a similar manner to gating transistor devices 632 and 372 found in latch 204. Transmission gate 302 is implemented using PMOS device 302a and NMOS device 302b, which are incorporated into the structure of multiplexer 212, which is implemented using PMOS devices 334, 342, 336, and 346, and NMOS devices 338, 340, 356, and 358. Transmission gate 302 is constructed and incorporated into multiplexer 212. Multiplexer 214 is performed by virtue of the inverter structures included in multiplexer 212. For example, according to the connections between PMOS device 316 and NMOS device 318, data input D provided to the node coupling the respective gate terminals of PMOS device 316 and NMOS device 318, the actual data output by multiplexer 214 when selecting data input D will be an inverted version of that data input, provided at the node coupling the respective drain terminals of PMOS device 316 and NMOS device 318. A similar data inversion takes place when multiplexer 214 selects the output from latch 202. In the illustrated embodiment, an extra delay (pair of series inverters) is added to delay the SE signal to the multiplexer 214. The additional delay may permit the FCLK to turn off (go low) before D to latch 204 path is opened via the SE signal switching from high to low in the clk high phase case. This is to prevent data D from overriding the scan shift-in in the latch 204 before the capture cycle.

As previously mentioned, FIG. 4 shows the timing diagram illustrating the timing of various signals during operation of scan flop 200 when the SE signal is toggled during a low phase of the main clock signal CLK. It should be noted that the timing diagram equally applies to the embodiments shown in FIG. 2b and FIG. 3. For ease of illustration, references with regards to the timing diagram shown in FIGS. 4 and 5 will be made to scan flop 300 shown in FIG. 2b. As seen in FIG. 4, when the SE signal is asserted, the state of the SE signal corresponds to a shift cycle, and FCLK tracks main clock signal CLK. When the SE signal is toggled to enter a scan cycle, or capture cycle during a low phase of clock signal CLK, multiplexer 212 and 214 will be selecting the value appearing at the D input of the scan flop. While the clock signal CLK and SE are both in a low logic state (logic '0'), the output of NAND gate 310 will be at a high logic state, resulting in a high logic state at the lower input of NAND gate 312. Since the CLK signal is in a low logic state, the upper input of NAND gate 312 will be at a low logic state, resulting in a high logic state at the output of NAND gate 312, yielding a low phase (low logic value) of FCLK at the output of inverter 360. Thus, FCLK continues to track CLK until the point in time when the clock signal CLK changes to a high phase.

At the point the clock signal CLK changes to a high phase, the upper value at the upper input of NAND gate 312 will change to high logic state, while the lower input of NAND gate 312 still resides at a high logic state, resulting in the output of NAND gate 312 dropping to a low logic state, yielding a rise in FLCK, shown as pulse P1 in FIG. 4. However, since the CLK signal has changed to a high logic state, the upper input of NAND gate 310 also changes to a high logic state (after a delay through inverters 306 and 308), with the lower input of NAND gate 310 still residing at a high logic state due to SE residing in a low logic state. This results in the output of NAND gate changing from a logic high state to a logic low state, which propagates to NAND gate 312 and presents a low logic state at the lower input of NAND gate 312. This in turn changes the state of the output of NAND gate 312 to a logic high state, causing FCLK at the output of inverter 360 to change to a low logic state. Thus, the width (ΔT) of pulse P1 in FIG. 4 may be determined by the delay it takes for the change in the value of CLK to propagate through NAND gate 310 and inverters 308 and 306.

Since the SE signal is in a low logic state during pulse P1, the current value appearing at data input D of the scan flop may be selected by multiplexer 214, and may therefore be latched into latch 204. This way, latch 204 may be holding the captured scan test result data, which may then be shifted out of the scan flop through the SDO to SDI connections between the scan flops in the chain (as shown, for example, in FIG. 1). The shift process may begin once the SE signal is toggled back to a high logic state, also during a low phase of the CLK signal as shown in FIG. 4. While scan result data may be captured in this manner when the SE signal is toggled during a low phase of the clock signal, it may be possible that erroneous data is returned despite the fact that the logic, or circuitry being tested is in fact functioning properly. This may result from the pulse P1 not operating properly, for example when the pulse width ΔT is not sufficient for latch 204 to properly latch the data. However, functionality of the pulse P1 may be determined based on scan test results obtained when toggling the SE signal during a high phase of clock signal CLK.

As previously mentioned, FIG. 5 shows the timing diagram illustrating the timing of various signals during operation of various embodiments of a scan flop disclosed herein, when the SE signal is toggled during a high phase of the main clock signal CLK. As seen in FIG. 5, when the SE signal is asserted, the state of the SE signal corresponds to a shift cycle, and FCLK tracks main clock signal CLK. When the SE signal is toggled to enter a scan cycle, or capture cycle during a high phase of clock signal CLK, multiplexer 212 and 214 will be selecting the value appearing at the D input of the scan flop. When the SE signal toggles to a low logic state, the clock signal CLK will still reside in a high logic state (logic '1'), while SE will now enter a low logic state (logic '0'). As a result, the lower input of NAND gate 310 will change to a high logic state, and change the output of NAND gate 310 from a high logic state to a low logic state, which will then propagate to NAND gate 312 and present a low logic state at the lower input of NAND gate 312. This in turn changes the state of the output of NAND gate 312 to a logic high state, causing FCLK at the output of inverter 360 to change to a low logic state. The delay from the SE signal toggling to a low logic state and FCLK changing to a low logic state may again be determined by the delay it takes for the change in the value of SE to propagate through NAND gate 310.

When the clock signal CLK transitions to a low logic state, the output of NAND gate 312 will remain unaffected, while the upper input of NAND gate 312 changes to logic high. Thus, FCLK will continue to track the clock signal CLK until the CLK signal transitions to a high state at the end to time period T3. However, when the clock signal CLK transitions to a low state, because multiplexer 212 is currently selecting the value appearing at the data input D of the scan flop, that data value will be latched into latch 202. Because the SE signal remains in a low logic state all through time period T3, and even some time period thereafter, the value in latch 202 will remain unchanged and hold the captured data from the data input D until next time the clock CLK transitions to a low state once the SE signal has transitioned back to a high logic state. Once the CLK signal transitions back to a high state, a narrow pulse (like pulse P1 shown in FIG. 4) will be generated in a manner similar than in FIG. 4. Thus, the value appearing at data input D may be latched into latch 204. However, the correct data, that is the scan result data from the D input may still be latched into latch 204 even if the narrow pulse isn't wide enough, or other timing problems may be experienced in association with the narrow pulse.

As seen in FIG. 5, because the SE signal transitions back to a high logic state while the clock signal CLK is still in a high phase (that is, residing in a high logic state), once the change in SE propagates through NAND gate 310, FCLK will again begin following clock signal FCLK, resulting in a wide pulse, which may latch the output from latch 202 into latch 204. Because latch 202 is updated during the low phase of clock signal CLK, at this point it will still hold the captured scan test data, ensuring that the captured scan test data is written into latch 204 from latch 202 during pulse P2. Thus, the SE signal may be toggled during either phase of the clock signal CLK, with the expectation of shifting out the actual captured data from the scan chain.

Figure 6:
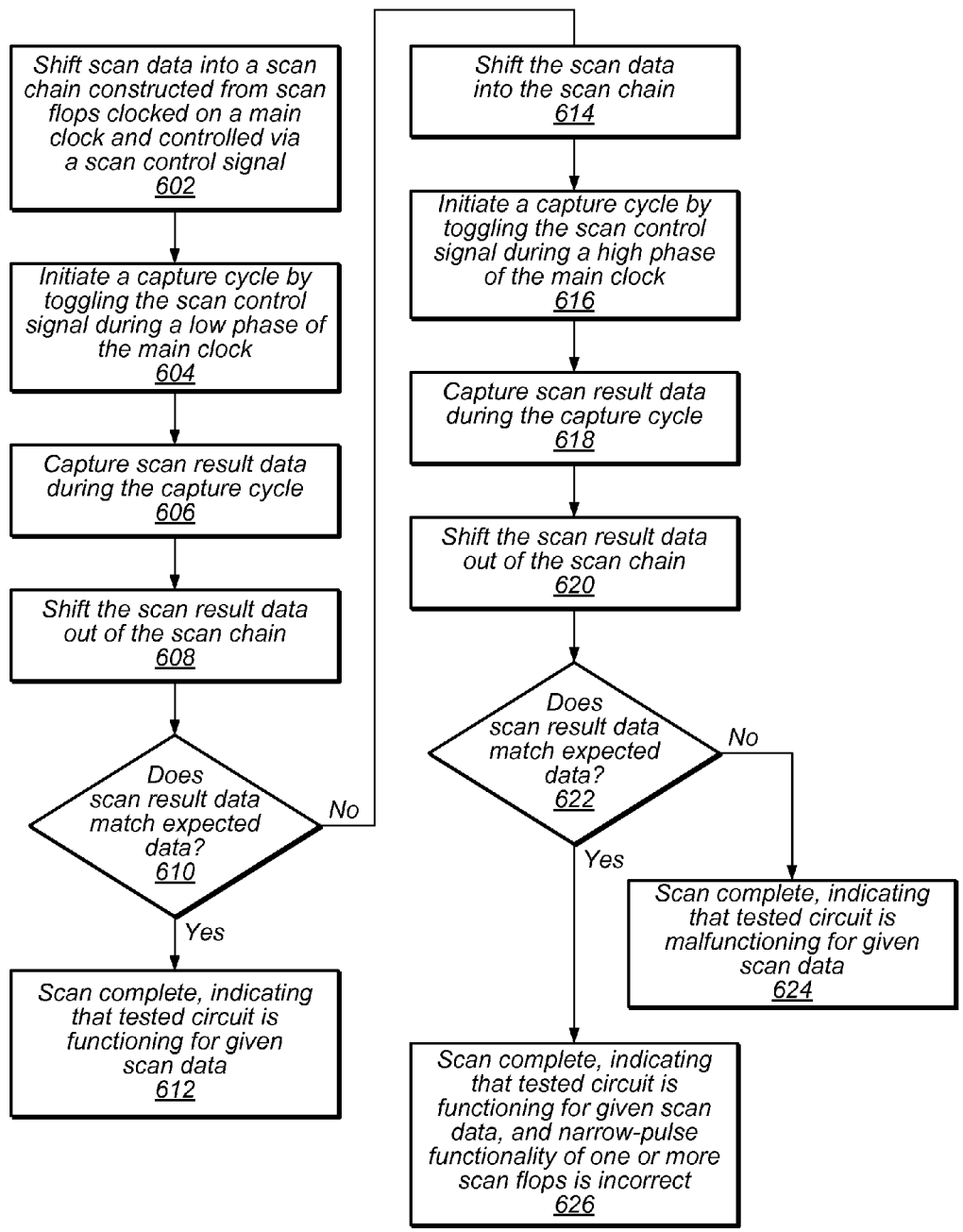
FIG. 6 shows a flow chart illustrating how a scan test may be performed using novel scan flip flops according to one embodiment.

According to at least the benefit gained from toggling the SE signal during a high phase of the main clock CLK, the operation of narrow pulse P1 (shown in FIG. 4 for when the SE signal is toggled during a low phase of the main clock CLK) may itself be tested, using scan flop 200. FIG. 6 shows the flow chart for performing a scan test according to one embodiment. The scan test may be performed by first shifting scan data into a scan chain comprising scan flops that may be operated like scan flop 200, coupled in sequence, with each scan flop having a scan output coupled to a scan input of the next scan flop in the sequence, and each scan flop having a regular data input and a regular data output coupled to the internal circuitry that is currently being tested (602). Once the scan data has been shifted into the scan chain, the scan control signal may be toggled during a low phase of the main clock signal CLK to initiate a scan cycle, or capture cycle (604). The data capture may be performed (606), for example according to the timing and corresponding operation previously described with respect to FIG. 4. Following the capture cycle, the data may be shifted out of the scan chain (608), and compared against expected data (610). If the comparison indicates that the scan result data matches the expected data (the "Yes" branch from 610), the scan operation is complete, indicating that the tested circuitry is functioning properly for the given scan data input.

If the comparison indicates that the scan result data does not match the expected data (the "no" branch from 610), the previous process may be repeated, but this time toggling the scan control signal during the high phase of the CLK signal. Thus, the same scan data may again be shifted into the scan chain (614), and a capture cycle may be initiated by toggling the SE signal during a high phase of the main clock signal (616). The data capture may be performed (618), for example according to the timing and corresponding operation previously described with respect to FIG. 5. Following the capture cycle, the data may be shifted out of the scan chain (620), and it may be compared against the expected data (622). If the comparison indicates that the scan result data matches the expected data ("Yes branch from 622), then it may be an indication that the tested circuitry is operating properly for the given scan data, but the narrow-pulse functionality in one or more of the scan flops may be incorrect (626). Conversely, if the comparison indicates that the scan result data does not match the expected data ("No" branch from 622), then the tested circuit may be malfunctioning for the given scan data (624).

System

Figure 7:
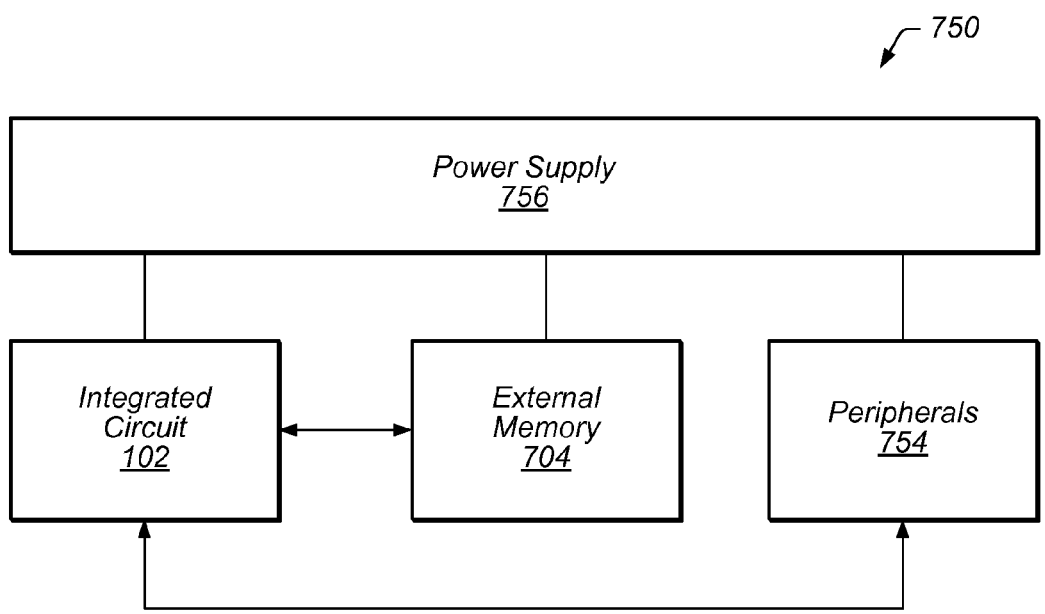
FIG. 7 is a block diagram of one embodiment of a system.

Turning next to FIG. 7, a block diagram of one embodiment of a system 750 is shown. In the illustrated embodiment, the system 750 includes at least one instance of an integrated circuit 402 coupled to an external memory 704. The integrated circuit 102 is further coupled to one or more peripherals 754. A power supply 756 is also provided which supplies the supply voltages to the integrated circuit 102 as well as one or more supply voltages to the memory 704 and/or the peripherals 754. In some embodiments, more than one instance of the integrated circuit 102 may be included (and more than one external memory 704 may be included as well).

The peripherals 754 may include any desired circuitry, depending on the type of system 750. For example, in one embodiment, the system 750 may be a mobile device (e.g. personal digital assistant (PDA), smart phone, etc.) and the peripherals 754 may include devices for various types of wireless communication, such as wifi, Bluetooth, cellular, global positioning system, etc. The peripherals 754 may also include additional storage, including RAM storage, solid state storage, or disk storage. The peripherals 754 may include user interface devices such as a display screen, including touch display screens or multitouch display screens, keyboard or other input devices, microphones, speakers, etc. In other embodiments, the system 750 may be any type of computing system (e.g. desktop personal computer, laptop, workstation, net top etc.).

Numerous other variations and modifications will become apparent to those with ordinary skill in the art once the above disclosure is fully appreciated. It is intended that the following claims be interpreted to embrace all such variations and modifications.

We claim:

1. A method for performing a scan operation on a scan flop having a scan input and a scan output, and comprising a first latch and a second latch, the method comprising:
   during each clock cycle of a specified number of clock cycles of a first clock signal, wherein the clock cycle has a low phase and a high phase:
      when a scan control signal is in a first state for at least the duration of the high phase of the clock cycle, or for at least the duration of the low phase of the clock cycle, or for the duration of the clock cycle:
         capturing scan data through the scan input of the scan flop via a first multiplexer into the first latch during the low phase of the clock cycle, wherein the scan flop is coupled to provide test stimulus data to internal logic circuitry of an integrated circuit (IC), the internal logic circuitry being configured to perform one or more logic functions; and
         shifting the captured scan data from the first latch into the second latch during the high phase of the clock cycle;
      when the scan control signal is in a second state for at least the duration of the high phase of the clock cycle, capturing input data through a data input of the scan flop via a second multiplexer into the second latch according to a second clock signal; and
   when the scan control signal is in the second state for at least the duration of the low phase of the clock cycle:
      capturing the input data through the data input of the scan flop via the first multiplexer into the first latch during the low phase of the clock cycle; and
      shifting the captured input data from the first latch into the second latch according to the second clock signal.

2. The method of claim 1, further comprising providing data stored in the second latch at a data output of the scan flop and at the scan output of the scan flop.

3. The method of claim 1, further comprising generating the second clock signal from the first clock signal.

4. The method of claim 3, wherein capturing the input data through a data input of the scan flop into the second latch according to the second clock signal comprises capturing the input data according to a narrow pulse of the second clock signal triggered by a rising edge of the first clock signal.

5. The method of claim 1, further comprising one of:
toggling the scan control signal from the first state to the second state during a high phase of the first clock signal; and
toggling the scan control signal from the first state to the second state during a low phase of the first clock signal.

6. A method for performing a scan operation, the method comprising:
receiving input data at a regular data input of a first scan flop from circuitry being tested, wherein the circuitry is logic circuitry internal to an integrated circuit, wherein the logic circuitry is configured to perform one or more logic functions;
toggling a scan control signal, during a low phase of a first clock signal, from a first state indicative of a shift cycle to a second state indicative of a scan cycle;
in response to toggling the scan control signal, selecting the input data from the regular data input of the first scan flop;
latching the selected input data via a first multiplexer into a first latch of the first scan flop according to a pulse triggered by a rising edge of the first clock signal; and
the first latch of the first scan flop providing the selected input data as scan output data at a scan data output of the first scan flop;
wherein the method further comprises, when the scan control signal is in the second state for at least the duration of the high phase of the clock cycle, capturing input data from the regular data input through a second multiplexer into the second latch according to a second clock signal.

7. The method of claim 6, wherein the latching is performed on a narrow pulse triggered by a rising edge of a high phase of the first clock signal immediately succeeding the low phase of the first clock signal during which the toggling is performed.

8. The method of claim 6, further comprising:
receiving the scan output data at a scan data input of the second scan flop;
toggling the scan control signal from the second state indicative of a scan cycle to the first state indicative of a shift cycle;
in response to toggling the scan control signal from the second state to the first state, selecting the scan output data from the scan data input of the second scan flop;
latching the selected scan output data into a first latch of the second scan flop during a low phase of the first clock signal; and
latching the selected scan output data from the first latch of the second scan flop into a second latch of the second scan flop according to a pulse triggered by a rising edge of a clock signal succeeding the low phase of the first clock signal.

9. The method of claim 8, further comprising the second latch of the second scan flop providing the selected scan output data at a scan data output of the second scan flop for a scan data input of a third scan flop.

10. A method for performing a scan test:
shifting scan data into a scan chain comprising scan flops coupled in sequence, wherein each scan flop has a scan output coupled to a scan input of a next scan flop in the sequence, and wherein each scan flop has a regular data input and a regular data output coupled to logic circuitry internal to an integrated circuit, wherein the logic circuitry is configured to perform one or more logic functions, wherein each scan flop is configured to provide test input data to its correspondingly coupled logic circuitry;
subsequent to shifting the scan data into the scan chain, toggling a scan control signal during a low phase of a first clock signal to initiate a scan cycle;
in response to toggling the scan control signal, each scan flop:
selecting respective input data from its respective regular data input, wherein the respective input data corresponds to expected data from the circuitry being tested according to the scan data;
latching the selected respective input data through a first multiplexer into a respective first latch of the scan flop according to a respective first pulse triggered by a rising edge of the first clock signal; and
providing the selected respective input data as respective scan output data at the scan output of the scan flop for the scan input of the next scan flop in the sequence, as part of first scan result data; and
shifting the first scan result data out of the scan chain;
wherein the method further comprises each scan flop capturing input data from the regular data input through a second multiplexer into the second latch according to a second clock signal when the scan control signal is toggled and held for at least the duration of the high phase of the clock cycle.

11. The method of claim 10, further comprising:
comparing the first scan result data with expected data; and
in response to determining from the comparing that the scan result data does not match the expected data:
shifting the scan data into the scan chain;
subsequent to shifting the scan data into the scan chain, toggling the scan control signal during a high phase of the clock signal to initiate a scan cycle;
in response to toggling the scan control signal, each scan flop:
selecting respective input data from its respective regular data input, wherein the respective input data corresponds to expected data from the circuitry being tested according to the scan data;
latching the selected respective input data into a respective first latch of the scan flop during a low phase of the first clock signal;
latching the selected respective input data from its respective first latch into a respective second latch of the scan flop according to a respective second pulse triggered by a rising edge of the first clock signal; and
providing the selected respective input data as respective scan output data at the scan output of the scan flop for the scan input of the next scan flop in the sequence, as part of second scan result data; and
shifting the second scan result data out of the scan chain.

12. The method of claim 11, further comprising:
comparing the second scan result data with the expected data;
determining that the respective first pulse in at least one of the scan flops is not operating properly if the comparing indicates that the second scan result data matches the expected data; and
determining that the circuitry being tested is defective if the comparing indicates that the second scan result data does not match the expected data.

13. The method of claim 11, wherein each respective second pulse is substantially wider than each respective first pulse.

14. A scan flop comprising:
- a regular data input coupled to a first input of a first multiplexer and a first data input of a second multiplexer;
- a scan data input coupled to a second input of the first multiplexer;
- a first latch having a data input coupled to an output of the first multiplexer and further comprising a data output coupled to a second input of the second multiplexer, wherein the first latch is further coupled to receive a first clock signal;
- a second latch having a data input coupled to an output of the second multiplexer and a data output coupled to a first input of a third multiplexer, wherein the third multiplexer is coupled to provide a scan data output for the scan flop, wherein the second latch is further coupled to receive a second clock signal; and
- a clock generation circuit configured to derive the second clock signal from the first clock signal.

15. The scan flop as recited in claim 14, wherein the clock generation circuit is coupled to receive a scan control signal, wherein the clock generation circuit is configured to provide the second clock signal as following the first clock signal responsive to receiving the scan control signal in a first state, and wherein the clock generation circuit is further configured to provide the second clock signal as a pulse having a duty cycle less than a duty cycle of the first clock signal responsive to receiving the scan control signal in a second state.

16. The scan flop as recited in claim 14, wherein the first multiplexer is coupled to receive a scan control signal on its select input, and wherein the second multiplexer is coupled to receive a delayed version of the scan control signal on its select input.

17. The scan flop as recited in claim 16, wherein the first multiplexer is configured to select the scan data input when the scan control signal is in a first state and is further configured to select the regular data input when the scan control signal is in a second state.

18. The scan flop as recited in claim 16, wherein the second multiplexer is configured to select the output of the first latch when the scan control signal is in a first state and is further configured to select the regular data input when the scan control signal is in a second state.

* * * * *